US012568869B2

(12) United States Patent
Kirby et al.

(10) Patent No.: US 12,568,869 B2
(45) Date of Patent: Mar. 3, 2026

(54) SEMICONDUCTOR DEVICE CIRCUITRY FORMED FROM REMOTE RESERVOIRS

(71) Applicant: Micron Technology, Inc., Boise, ID (US)

(72) Inventors: Kyle K. Kirby, Eagle, ID (US); Terrence B. McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 373 days.

(21) Appl. No.: 18/237,202

(22) Filed: Aug. 23, 2023

(65) Prior Publication Data

US 2024/0071989 A1 Feb. 29, 2024

Related U.S. Application Data

(60) Provisional application No. 63/401,683, filed on Aug. 28, 2022.

(51) Int. Cl.
*H01L 23/00* (2006.01)

(52) U.S. Cl.
CPC .............. *H01L 24/80* (2013.01); *H01L 24/08* (2013.01); *H01L 2224/08145* (2013.01); *H01L 2224/80125* (2013.01); *H01L 2224/80895* (2013.01); *H01L 2224/80896* (2013.01)

(58) Field of Classification Search
CPC ..................... H01L 24/80; H01L 24/08; H01L 2224/08145; H01L 2224/80125; H01L 2224/80895; H01L 2224/80896
See application file for complete search history.

(56) References Cited

U.S. PATENT DOCUMENTS

2018/0323133 A1* 11/2018 Kirby .................. H01L 23/5227
2019/0319007 A1* 10/2019 Uzoh ...................... H01L 24/30

* cited by examiner

*Primary Examiner* — Ratisha Mehta
(74) *Attorney, Agent, or Firm* — Dorsey & Whitney LLP

(57) ABSTRACT

This document discloses techniques, apparatuses, and systems for semiconductor device circuitry formed from remote reservoirs. A semiconductor assembly includes a first semiconductor die with a layer of dielectric material having an opening. The first semiconductor die further includes a reservoir of conductive material having a first portion located adjacent to the opening, a second portion remote from the opening, and a third portion coupling the first portion and the second portion. A second semiconductor die includes a layer of dielectric material and a contact pad corresponding to the opening. The reservoir of conductive material is heated to volumetrically expand the second portion into the third portion, the third portion into the first portion, and the first portion through the opening to form an interconnect electrically coupling the first semiconductor die and the second semiconductor die at the contact pad. In this way, a connected semiconductor device may be assembled.

20 Claims, 7 Drawing Sheets

100a

102

110

106

108

112

104

100b

102

114

104

300a

302

318

310

316    314

306

308

312

320

304

500

600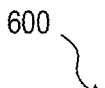

Provide a first semiconductor die including a first layer of dielectric material having an opening and a reservoir of conductive material having a first portion located adjacent to the opening, a second opening remote from the opening, and a third portion coupling the first portion and the second portion
602

Provide a second semiconductor die including a second layer of dielectric material and a contact pad corresponding to the opening
604

Align the first semiconductor die and the second semiconductor die such that the opening aligns with the contact pad
606

Heat the reservoir of conductive material effective to cause the second portion to volumetrically expand into the third portion, the third portion to volumetrically expand into the first portion, and the first portion to volumetrically expand through the opening to form an interconnect electrically coupling the first semiconductor die and the second semiconductor die at the contact pad
608

*FIG. 6*

SEMICONDUCTOR DEVICE CIRCUITRY FORMED FROM REMOTE RESERVOIRS

CROSS-REFERENCE TO RELATED APPLICATION(S)

The present application claims priority to U.S. Provisional Patent Application No. 63/401,683, filed Aug. 28, 2022, the disclosure of which is incorporated herein by reference in its entirety.

TECHNICAL FIELD

The present disclosure generally relates to semiconductor device assemblies and, more particularly, relates to semiconductor device circuitry formed from remote reservoirs.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 6 illustrates an example method for fabricating a semiconductor device assembly in accordance with an embodiment of the present technology.

DETAILED DESCRIPTION

Semiconductor devices are integrated in many devices to implement memory cells, processor circuits, imager devices, and other functional features. As more applications for semiconductor devices are discovered, designers are tasked with creating improved devices that can perform a greater number of operations per second, store greater amounts of data, or operate with a higher level of security. To accomplish this task, designers continue to develop new techniques to increase the number of circuit elements on a semiconductor device without increasing the size of the device. This development, however, may not be sustainable due to various challenges that arise from designing semiconductor devices with high circuit density. Thus, additional techniques may be required to continue the growth in capability of semiconductor devices.

One such technique is to implement multiple semiconductor dies within a single package. These multiple dies may be stacked to increase the number of circuit elements within the package without increasing a footprint (e.g., horizontal area) of the device. Stacked semiconductor devices (e.g., three-dimensional interface (3DI) packaging solutions) are often implemented as a set of multiple semiconductor dies disposed on silicon wafers. Each of the multiple semiconductor dies may include metallization layers that provide various functionality. These semiconductor dies are physically and electronically connected to one another to enable electrical communication between the dies. Many solutions for connecting semiconductor dies, however, may be sub-optimal for producing a reliable, well-connected semiconductor device. One such semiconductor device assembly is illustrated by way of example in FIGS. 1A and 1B.

Figures 1A, 1B:
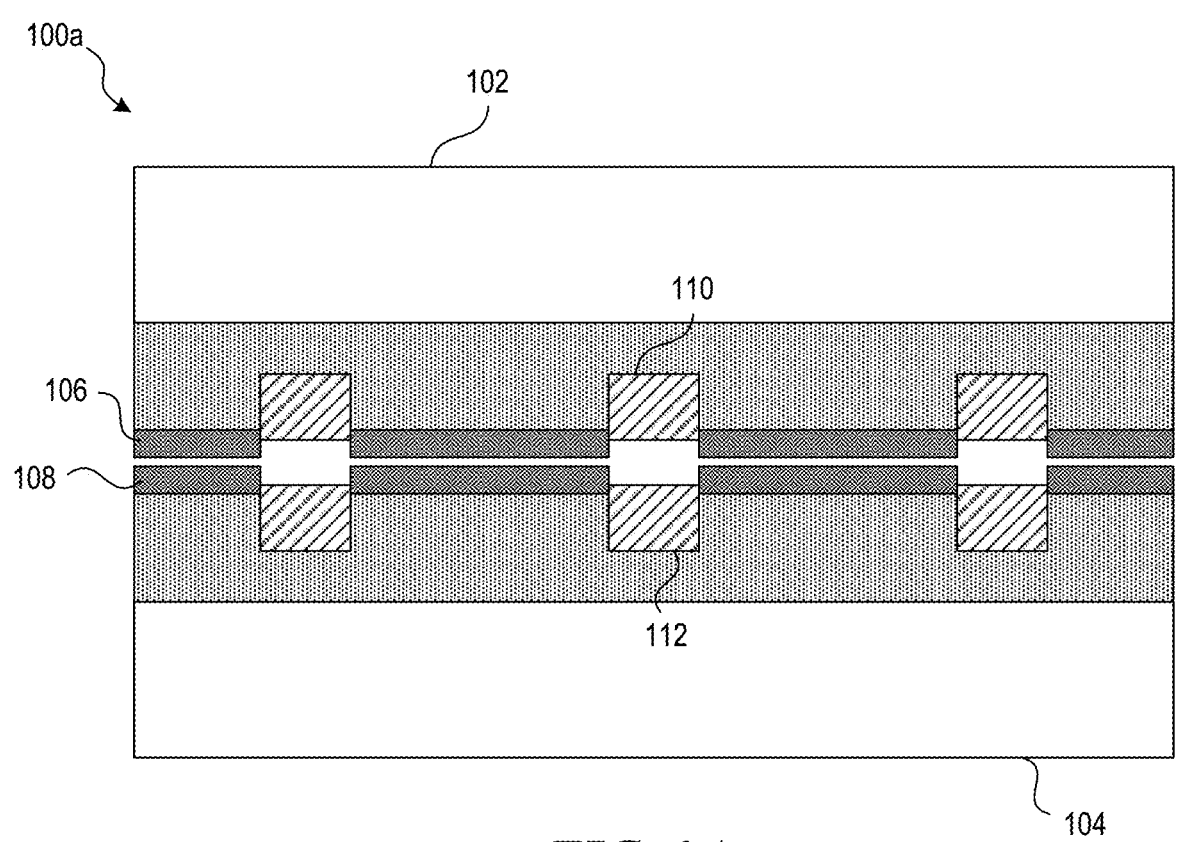
FIGS. 1A and 1B illustrate simplified schematic cross-sectional views of a series of fabrication steps for semiconductor device assemblies.

Beginning with FIG. 1A, a semiconductor device assembly 100a includes a semiconductor die 102 and a semiconductor die 104. The semiconductor die 102 includes a die substrate, a metallization layer, and a dielectric layer 106 at a bonding surface of the semiconductor die 102. The semiconductor die 104 may include a die substrate, a metallization layer, and a dielectric layer 108 at a bonding surface of the semiconductor die 104. The dielectric layer 106 and the dielectric layer 108 may act as a passivized, outermost portion of the semiconductor dies that insulates circuitry and connections thereon (e.g., at a metallization layer or at the die substrate). Conductive material 110 may be placed along portions of the dielectric layer 106 and conductive material 112 may be placed along portions of the dielectric layer 108. The conductive material 110 and the conductive material 112 may be recessed from the dielectric layer 106 and the dielectric layer 108, respectively, to form openings for the conductive material 110 and the conductive material 112 to expand into. In the semiconductor device assembly 100a of FIG. 1A, the conductive material 110 and the conductive material 112 have a width substantially equal to a width of the openings created in the dielectric layer 106 and the dielectric layer 108 (e.g., within 0.1 micron, within 0.5 micron, within 1 micron, etc.).

The semiconductor die 102 may be aligned with the semiconductor die 104 such that the conductive material 110 aligns with the conductive material 112. Once aligned, the semiconductor die 102 and the semiconductor die 104 may be coupled (e.g., stacked) and electrically connected. This coupling process may include heating the dielectric layer 106, the dielectric layer 108, the conductive material 110, and the conductive material 112. While the structures are heated, force may be applied to the semiconductor die 102 and the semiconductor die 104 to bring the dielectric layer 106 in contact with the dielectric layer 108 and cause the conductive material 110 and the conductive material 112 to volumetrically expand through the openings. The resulting semiconductor device assembly is illustrated by way of example in FIG. 1B.

FIG. 1B illustrates an electrically connected semiconductor device assembly 100b. The dielectric layer 106 and the dielectric layer 108 may bond to physically couple the semiconductor die 102 and the semiconductor die 104. The semiconductor die 102 and the semiconductor die 104 are connected through interconnects 114 (e.g., conductive structures) coupled to circuitry at the semiconductor die 102 and the semiconductor die 104. The interconnects 114 may be formed through expansion of the conductive material 110 and the conductive material 112 through the openings in the dielectric layers. The conductive material 110 and the conductive material 112 may expand by an amount that causes the conductive material 110 to contact the conductive material 112, thereby enabling electrical signaling to pass from the conductive material 110 to the conductive material 112 and vice versa.

Semiconductor devices assembled through this process may be required to satisfy various design constraints. For example, conductive material used to form the interconnects 114 may only be implemented with widths that are substantially equivalent to the width of the openings. Similarly, the conductive material may need to be placed along a same central axis as the openings. In general, each of the interconnects 114 may be formed from a single, continuous portion of conductive material at each semiconductor die. In this way, a large space may be needed to implement enough conductive material to form the interconnects 114. Thus, the location of the conductive material may be largely restricted and inhibit the implementation of some semiconductor device designs.

To address these drawbacks and others, various embodiments of the present application exploit the thermophysical properties of conductive material, such as copper. When heated, conductive material may expand in volume based on a coefficient of expansion. Given that this expansion is predictable, semiconductor devices may be designed with reservoirs of conductive material located adjacent to vacancies to enable the conductive material to expand into these vacancies and create connective structures that couple the various circuit components in the semiconductor device. In doing so, a robust and well-connected semiconductor device may be assembled through the thermal expansion of conductive material.

For example, a semiconductor assembly is described that includes a first semiconductor die with a layer of dielectric material having an opening. The first semiconductor die further includes a reservoir of conductive material having a first portion located adjacent to the opening, a second portion remote from the opening, and a third portion coupling the first portion and the second portion. A second semiconductor die includes a layer of dielectric material and a contact pad corresponding to the opening. The reservoir of conductive material is heated to volumetrically expand the second portion into the third portion, the third portion into the first portion, and the first portion through the opening to form an interconnect electrically coupling the first semiconductor die and the second semiconductor die at the contact pad.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a die-level substrate, or another die for die-stacking or 3DI applications.

Although some examples may be illustrated or described with respect to dies or wafers, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 2A:
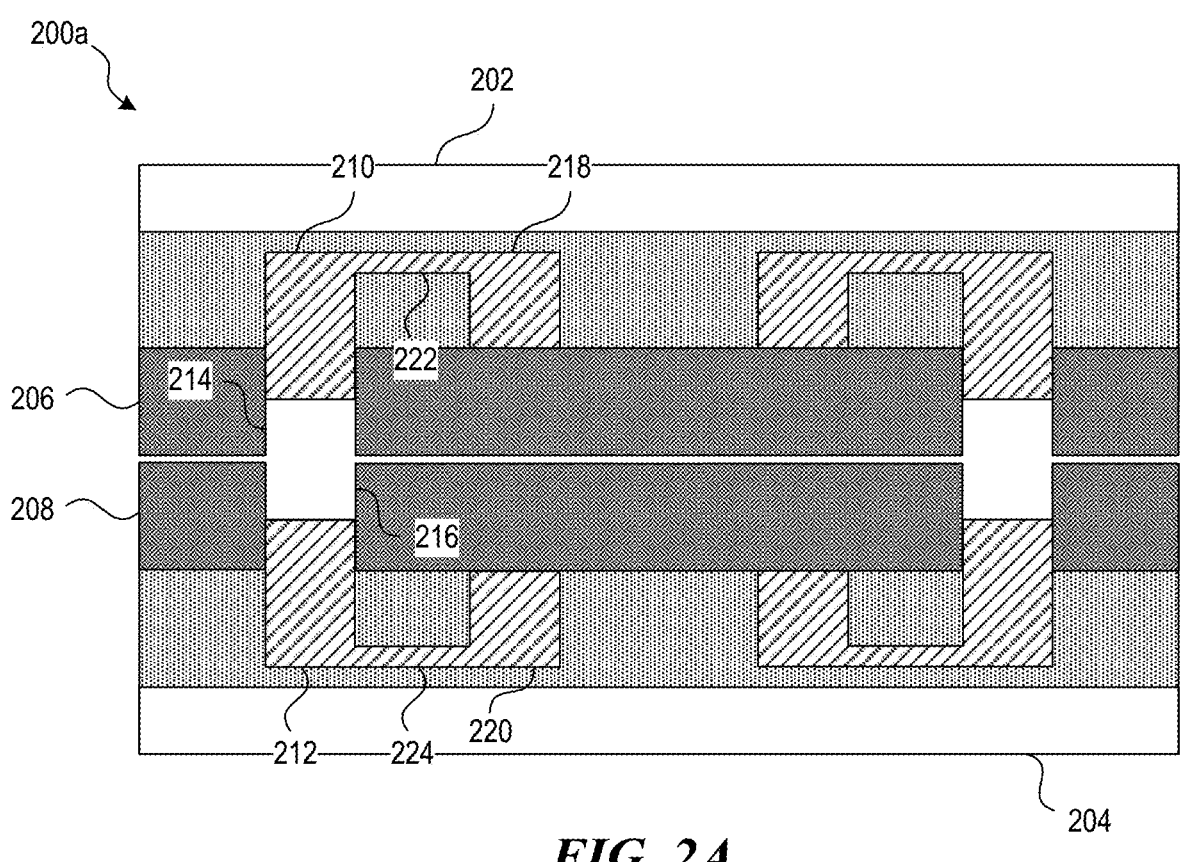
FIGS. 2A and 2B illustrate simplified schematic cross-sectional views of a series of fabrication steps for semiconductor device assemblies in accordance with an embodiment of the present technology.
Figure 2B:
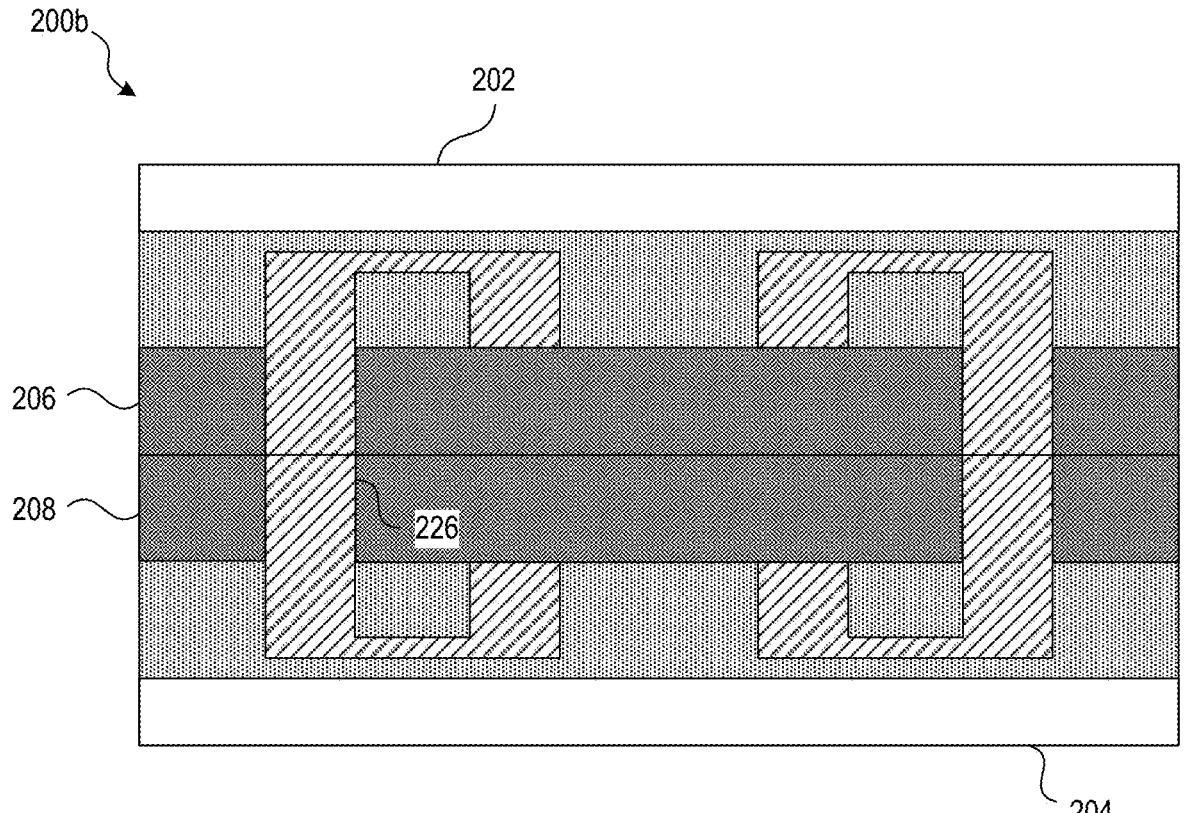

FIGS. 2A and 2B illustrate operations for fabricating a semiconductor device assembly in accordance with an embodiment of the present technology. Beginning with FIG. 2A, a semiconductor device assembly 200a that includes a semiconductor die 202 and a semiconductor die 204 is illustrated. The semiconductor die 202 includes a die substrate and a metallization layer having layers of dielectric material and conductive material to form connective structures coupled to circuitry at the die substrate. The semiconductor die 202 further includes a dielectric layer 206 that acts as a passivation layer to insulate circuitry and connections at the semiconductor die 202 (e.g., at the die substrate or the metallization layer). The dielectric layer 206 may include dielectric material, for example, silicon oxide, silicon nitride, silicon carbide, or silicon carbon nitride. The dielectric layer 206 may be created through any appropriate technique, for example, oxidation or deposition. Circuitry or dielectric material may be disposed at the die substrate beneath the dielectric layer 206 (e.g., at the metallization layer) to implement traces, lines, vias, transistors, or other circuit elements within the semiconductor die 202. Similarly, the semiconductor die 204 includes a dielectric layer 208. The semiconductor die 204 may include a die substrate and a metallization layer, with circuitry and dielectric layers thereon, beneath the dielectric layer 208. The semiconductor die 202 and the semiconductor die 204 may further include one or more reservoirs of conductive material 210 and one or more reservoirs of conductive material 212, respectively.

One or more openings 214 and one or more openings 216 may be implemented at the dielectric layer 206 and the dielectric layer 208, respectively. The reservoirs of conductive material 210 may be located adjacent to the openings 214, and the reservoirs of conductive material 212 may be located adjacent to the openings 216. The reservoirs of conductive material 210 and the reservoir of conductive material 212 may be exposed at the openings 214 and the openings 216, respectively, to implement contact pads at which the semiconductor dies may electrically couple. Although illustrated as beneath the openings 214 and the openings 216, the reservoirs of conductive material may be located at least partially within the openings 214 or the openings 216 (e.g., recessed from a bonding surface of the dielectric layers). The openings 214 and the openings 216 may provide vacancies for the reservoirs of conductive material 210 and the reservoirs of conductive material 212 to expand into. Each of the openings 214 or the openings 216 may have a width large enough to implement an interconnect at the openings 214 or the openings 216. For example, an opening designed for a power interconnect may be wider than an opening designed for an input/output (I/O) interconnect to provide an interconnect with adequate cross-sectional area.

The reservoirs of conductive material 210 and the reservoirs of conductive material 212 may be located adjacent to the openings 214 and the openings 216, respectively. The reservoirs of conductive material 210 or the reservoirs of conductive material 212 may implement one or more contact pads exposed through the openings 214 and the openings 216, respectively, to couple the semiconductor dies. In aspects, the reservoir of conductive material 210 and the reservoir of conductive material 212 may be laterally aligned with one another or with the openings. For example, the reservoir of conductive material 210 and the reservoir of conductive material 212 may be aligned about a same vertical axis. The reservoirs of conductive material 210 and the reservoirs of conductive material 212 may be laterally aligned with the openings 214 and the openings 216, respectively (e.g., centered about a same central axis).

As illustrated in FIG. 2A, the reservoir of conductive material 210 has a width equivalent to the width of the opening 214, and the reservoir of conductive material 212 has a width equivalent to the width of the opening 216. However, the reservoirs of conductive material 210 or the reservoirs of conductive material 212 may have a width that is less than, greater than, or equal to the width of the openings 214 or the openings 216. In this way, the width of the reservoirs of conductive material may not be constrained to the width of the openings, thereby reducing design constraints in the semiconductor device. Further, although illustrated as having the same width, the reservoirs of conductive material 210 and the reservoirs of conductive material 212 may have different widths. Moreover, although illustrated with rectangular cross sections, the reservoirs of conductive material 210 or the reservoirs of conductive material 212 may have any appropriate cross section, for example, elliptical, rhomboidal, kite-shaped, or any other shape.

The semiconductor die 202 may further include reservoirs of conductive material 218 remote from the reservoirs of conductive material 210. The reservoirs of conductive material 218 may be discrete reservoirs (e.g., separated from the reservoirs of conductive material 210) located remote from the openings 214. The semiconductor die 204 may further include reservoirs of conductive material 220 remote from the reservoirs of conductive material 212 and located a distance from the openings 216. The reservoirs of conductive material 218 or the reservoirs of conductive material 220 may be located at least partially in the dielectric layer 206 and dielectric layer 208, respectively. In some implementations, the reservoirs of conductive material 218 may be at least partially located at a same vertical layer as the reservoirs of conductive material 210, and the reservoirs of conductive material 220 may be at least partially located at a same vertical layer as the reservoirs of conductive material 212.

The reservoirs of conductive material 210 and the reservoirs of conductive material 218 may couple through reservoirs of conductive material 222. The reservoirs of conductive material 222 may include any conductive structure that may couple the reservoirs of conductive material 210 and the reservoirs of conductive material 218. For example, the reservoirs of conductive material 222 may include one or more traces or one or more vias. The reservoirs of conductive material 222 may include a conductive material that is the same as the conductive material in the reservoirs of conductive material 210 and the reservoirs of conductive material 218. As a result, the reservoirs of conductive material 210 and the reservoirs of conductive material 218 may be continuous reservoirs of conductive material having different portions separated by dielectric material at the metallization layer and connected by reservoirs of conductive material 222. The semiconductor die 204 may similarly include reservoirs of conductive material 224 coupling the reservoirs of conductive material 212 and the reservoirs of conductive material 220.

The reservoirs of conductive material 222 may have a size configured to permit volumetric expansion of the reservoirs of conductive material 218 through the reservoirs of conductive material 222 to displace some of the conductive material from the reservoirs of conductive material 222 into the reservoirs of conductive material 210. For example, the reservoirs of conductive material 222 may be larger (e.g., 25 percent, 50 percent, 75 percent, 100 percent, 150 percent, 200 percent, 300 percent, 500 percent larger) than typical routing circuitry (e.g., traces, vias, lines, etc.) to permit the reservoirs of conductive material 218 to expand into the reservoirs of conductive material 222 and displace conductive material from the reservoirs of conductive material 222. The reservoirs of conductive material 224 may be similarly sized.

In some implementations, the reservoirs of conductive material 222 may have a width that is smaller or larger than a diameter of the reservoirs of conductive material 218 or a diameter of the reservoirs of conductive material 210. For example, the width of the reservoirs of conductive material 222 extending between the reservoirs of conductive material 218 and the reservoirs of conductive material 210 may be 25 percent, 50 percent, 75 percent, 100 percent, 150 percent, 200 percent, 300 percent, 500 percent, or any other amount larger than the diameter of the reservoirs of conductive material 218 or the reservoirs of conductive material 210. The reservoirs of conductive material 222 may have a lesser height (e.g., 25 percent, 50 percent, 75 percent, 100 percent, 150 percent, 200 percent, 300 percent, 500 percent less) than the reservoirs of conductive material 218 and the reservoirs of conductive material 210. The reservoirs of conductive material 222 may be disposed within the semiconductor die 202 at a same depth as the reservoirs of conductive material 210 or the reservoirs of conductive material 218. The reservoirs of conductive material 224 may be similarly sized with respect to the reservoirs of conductive material 220 and the reservoirs of conductive material 212.

The reservoirs of conductive material 218 and the reservoirs of conductive material 220 may have a particular shape and size. For example, the reservoirs of conductive material 218 may have a size that is smaller than a size of the reservoirs of conductive material 210. Similarly, the reservoirs of conductive material 220 may have a size that is smaller than the size of the reservoirs of conductive material 212. The reservoirs of conductive material 210 may have a lesser height (e.g., 25 percent, 50 percent, 75 percent, 100 percent, 150 percent, 200 percent, 300 percent, 500 percent less) or a lesser diameter (e.g., 25 percent, 50 percent, 75 percent, 100 percent, 150 percent, 200 percent, 300 percent, 500 percent less) than the reservoirs of conductive material 218. Alternatively, the reservoirs of conductive material 210 may have a greater height (e.g., 25 percent, 50 percent, 75 percent, 100 percent, 150 percent, 200 percent, 300 percent, 500 percent greater) or a greater diameter (e.g., 25 percent, 50 percent, 75 percent, 100 percent, 150 percent, 200 percent, 300 percent, 500 percent greater) than the reservoirs of conductive material 218. The reservoirs of conductive material 210 and the reservoirs of conductive material 212 may provide a majority of the conductive material for forming interconnects between the semiconductor dies. In this way, the reservoirs of conductive material 218 and the reservoirs of conductive material 220 may provide a smaller amount of conductive material that may be used to minorly adjust the formation of the interconnects. In other implementations, the size of the reservoirs of conductive material 218 or the reservoirs of conductive material 220 may be the same as or larger than the size of the reservoirs of conductive material 210 or the reservoirs of conductive material 212. Although illustrated with a rectangular cross section, the reservoirs of conductive material 218 or the reservoirs of conductive material 220 may have any other shape, for example, a rhomboidal shape, an elliptical shape, or a kite shape.

The openings 214 or the openings 216 may be created through any number of appropriate methods. For example, dielectric material may only be deposited around the openings 214 and openings 216. Alternatively, the dielectric material may be deposited equally across the semiconductor dies, and the openings 214 and the openings 216 may be etched into the dielectric layer 206 and the dielectric layer 208, respectively. The openings 214 or the openings 216 may be designed to have a depth, which as a non-limiting example may be between 0.5 and 1 micron. The reservoir of conductive material 210 and the reservoir of conductive material 212 may similarly be designed with a thickness. The thickness may be determined to enable the reservoirs of conductive material to volumetrically expand through the openings and contact one another based on the width of the openings, the width of the reservoirs of conductive material, and a thermal expansion coefficient of the conductive material. As non-limiting examples, the thickness may be between 5 and 10 microns. Moreover, the volume of reservoirs of conductive material formed from the reservoirs of conductive material 210, the reservoirs of conductive material 218, and the reservoirs of conductive material 222 may be an appropriate amount larger than a volume of the openings 214 to enable the conductive material to expand through the openings 214. For example, the volume of the reservoirs of conductive material may be at least five, 10, 100, or 1000 times the volume of the openings 214. A volume of the reservoirs of conductive material 212, the reservoirs of conductive material 220, and the reservoirs of conductive material 224 may be a similar amount larger than the openings 216.

The reservoirs of conductive material 210 and the reservoirs of conductive material 212 may be created through any appropriate method. For example, the die substrate may be etched, and conductive material may be deposited at various locations to enable the formation of interconnects. The reservoirs of conductive material 218 and the reservoirs of conductive material 220 may be formed through any combination of etching or deposition. For example, conductive material may be deposited in reservoirs during the formation of the metallization layers or the dielectric layer 206 and the dielectric layer 208. The reservoirs of conductive material 218 or the reservoirs of conductive material 220 may be embedded in the semiconductor die 202 and the semiconductor die 204. For example, the reservoirs of conductive material 218 or the reservoirs of conductive material 220 may be disposed under a portion of the dielectric layer 206 or a portion of the dielectric layer 206 that does not include the openings 214 or the openings 216. In this way, the reservoirs of conductive material 218 and the reservoirs of conductive material 220 may not be exposed at the exterior of the semiconductor dies.

The semiconductor die 202 and the semiconductor die 204 may be aligned such that the openings 214 correspond to the openings 216. The openings 214 and the openings 216 may be aligned to create one or more interconnect openings at which interconnects coupling the semiconductor dies may be implemented. In aspects, the interconnect openings may expose the reservoirs of conductive material 210 and the reservoirs of conductive material 212. In some instances, the dielectric layer 206 and the dielectric layer 208 may be bonded such that the alignment of the semiconductor dies is ensured and the openings 214 and the openings 216 remain aligned. The dielectric layers may be bonded before or during the interconnect formation process.

In some instances, the die coupling and interconnect formation process may include creating a vacuum condition around the semiconductor die 202 and the semiconductor die 204. An inert gas may be applied to the dielectric layer 206 or the dielectric layer 208. The reservoirs of the conductive material 210, the reservoirs of conductive material 212, the reservoirs of conductive material 218, the reservoirs of conductive material 220, the reservoirs of conductive material 222, and the reservoirs of conductive material 224 may be heated to alter properties of the conductive material. For example, the heating may cause the conductive material to expand through the openings. The reservoirs of conductive material 210 may expand through the openings 214. The reservoirs of conductive material 218 may expand into the reservoirs of conductive material 222 and force the reservoirs of conductive material 222 to expand into the reservoirs of conductive material 210. This may cause more conductive material from the reservoirs of conductive material 210 to expand into the openings 214. The reservoirs of conductive material at the semiconductor die 206 may similarly expand through the openings 216. In this way, the reservoirs of conductive material may extend through the interconnect openings to form interconnects electrically coupling the semiconductor die 202 and the semiconductor die 204. In some instances, the dielectric layer 206 and the dielectric layer 208 may be heated to alter properties of the dielectric material. For example, the dielectric material may become reactive to enable a direct bond between the dielectric layer 206 and the dielectric layer 208. Pressure may be applied to the semiconductor die 202 or the semiconductor die 204 to bond the dielectric layer 206 and the dielectric layer 208. The resulting semiconductor device assembly is illustrated by way of example in FIG. 2B.

FIG. 2B illustrates an example semiconductor device assembly 200*b* that includes the semiconductor die 202 mounted to the semiconductor die 204. The semiconductor die 202 and the semiconductor die 204 may bond to mechanically couple the semiconductor dies. The semiconductor dies may be bonded active side-to-active side, back side-to-back side, or active side-to-back side. The reservoirs of conductive material may extend through the interconnect openings to contact one another and form interconnects 226, electrically coupling the semiconductor die 202 and the semiconductor die 204. The interconnects 226 may be formed from multiple reservoirs at each opening. For example, the conductive material used to form the interconnects 226 may be expanded from the reservoirs of conductive material 210, the reservoirs of conductive material 212, the reservoirs of conductive material 222, the reservoirs of conductive material 218, the reservoirs of conductive material 220, and the reservoirs of conductive material 222.

Given that some portion of the reservoirs are located adjacent to the openings and some portions of the reservoirs are remote from the openings, the conductive material may extend in multiple directions to form the interconnects 226. For example, the reservoirs of conductive material 210 may expand vertically into the openings 214, and the reservoirs of conductive material 218 and the reservoirs of conductive material 222 may expand laterally through the reservoirs of conductive material 222 and into the reservoirs of conductive material 210 to cause more conductive material to expand through the openings 214. Similarly, the reservoirs of conductive material 212 may expand vertically into the openings 216, and the reservoirs of conductive material 220 and the reservoirs of conductive material 224 may expand laterally through the reservoirs of conductive material 224 and into the reservoirs of conductive material 212 to cause more conductive material to expand through the openings 216. Thus, the various portions of the reservoirs of conductive material may expand in different directions. As a result of annealing the conductive material, the reservoirs of conductive material may contact one another and form metal-metal bonds. As a result, the interconnects 226 may be formed to electrically couple the semiconductor die 202 and the semiconductor die 204.

The semiconductor device assembly 200*b* may have multiple advantages over the design illustrated by way of example in FIG. 1B. For example, the multiple remote reservoirs may provide multiple locations for conductive material to be implemented within the semiconductor dies. Each of the locations of conductive material may store an amount of conductive material that is less than the single-portion-of-conductive-material approach illustrated by way of example in FIGS. 1A and 1B. As a result, conductive material may be provided at previous unused locations within the semiconductor die. Thus, forming interconnects from remote reservoirs may reduce design constraints in the development process and enable a wider variety of designs to be implemented.

Figure 3A:
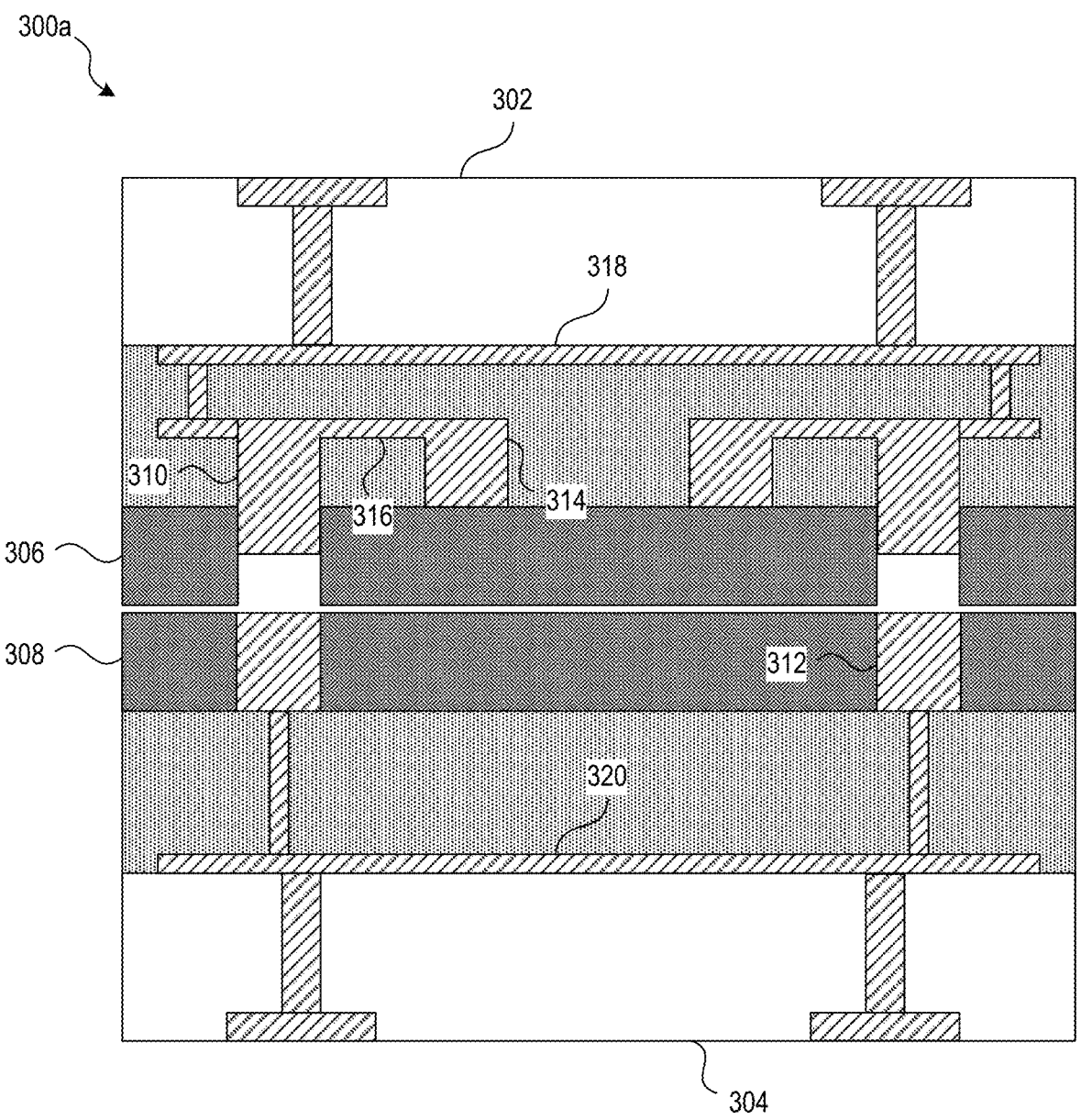
FIGS. 3A and 3B illustrate simplified schematic cross-sectional views of a series of fabrication steps for semiconductor device assemblies in accordance with an embodiment of the present technology.
Figure 3B:
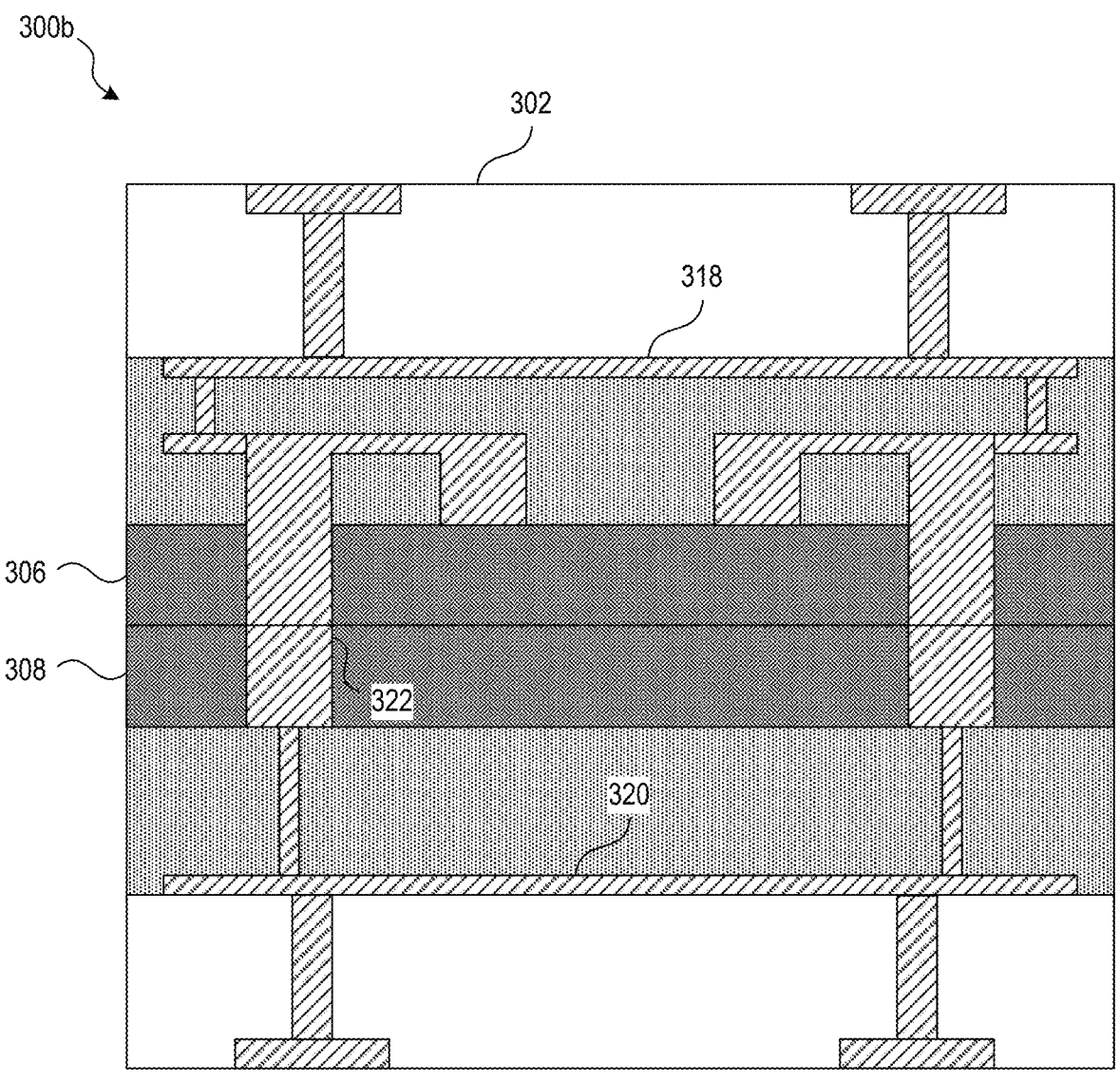

FIGS. 3A and 3B illustrate operations for fabricating a semiconductor device assembly in accordance with an embodiment of the present technology. As illustrated with reference to FIG. 3A, a semiconductor device assembly 300*a* includes a semiconductor die 302 and a semiconductor die 304. The semiconductor die 302 includes a dielectric layer 306 and reservoirs of conductive material 310 with various circuitry 318, including vias, traces, through-silicon vias (TSVs), and contact pads coupled therewith. The semiconductor die 302 may additionally include additional reservoirs of conductive material 314. The reservoirs of conductive material 310 and the reservoirs of conductive material 314 may couple through reservoirs of conductive material 316. The reservoirs of conductive material or the circuitry 318 may be at least partially disposed in a metallization layer of the semiconductor die. As illustrated, the circuitry 318 may not couple directly with the reservoirs of conductive material 314. Instead, the circuitry 318 may couple with the reservoirs of conductive material 314 indirectly through the reservoirs of conductive material 310 or the reservoirs of conductive material 316. In other implementations, the reservoirs of conductive material 314 may couple directly to the circuitry 318 or to other circuitry at the semiconductor die 304. The semiconductor die 304 similarly includes a dielectric layer 308 having contact pads 312 with various circuitry 318 coupled therewith. In contrast to the reservoirs of conductive material illustrated in FIGS. 2A and 2B, the semiconductor die 304 includes contact pads 312. The contact pads 312 may not expand when exposed to heat. In this way, the reservoir of conductive material 310, the reservoir of conductive material 314, and the reservoirs of conductive material 316 may be relied upon to form the interconnects between the semiconductor die 302 and the semiconductor die 304.

The reservoir of conductive material 310 may connect to circuitry 318 in the semiconductor die 302. The circuitry 318 may include one or more traces at a same layer of the semiconductor die 302 as the reservoirs of conductive material 316. Alternatively or additionally, the circuitry 318 may include vias that connect the reservoirs of conductive material (e.g., at the traces, the reservoirs of conductive material 310, the reservoirs of conductive material 314, or the reservoirs of conductive material 316) to various traces, transistors, or other circuitry in the semiconductor die 302. The circuitry 318 may include one or more TSVs that couple to contact pads exposed at a surface of the semiconductor die 302 to enable external connections to additional dies or to a printed circuit board (PCB). As a result, electrical signals may be carried from the reservoirs of conductive material 310, the reservoirs of conductive material 314, and the reservoirs of conductive material 316 to the contact pads at the upper surface or vice versa, and the die circuitry 318 may perform operations using these signals. Contact pads 312 may similarly connect to circuitry 320 that provides similar functionality with respect to the semiconductor die 304.

The semiconductor die 302 and the semiconductor die 304 may be coupled to one another to enable electrical communication between the circuitry 318 at the semiconductor die 302 and the circuitry 320 at the semiconductor die 304. Given that the semiconductor die 304 does not include reservoirs of conductive material, the semiconductor dies may be aligned such that the openings at the semiconductor die 302 align with contact pads 312 to enable the reservoirs of conductive material 310, the reservoirs of conductive material 314, and the reservoirs of conductive material 316 to expand and form interconnects at the contact pads 312. The resulting semiconductor device assembly is illustrated by way of example in FIG. 3B.

FIG. 3B illustrates an example semiconductor device assembly 300*b* that includes the semiconductor die 302 mounted to the semiconductor die 304. The dielectric layer 306 and the dielectric layer 308 may couple through a direct bond (e.g., dielectric bond) to mechanically couple the semiconductor dies. The semiconductor die 302 and the semiconductor die 304 electrically couple through interconnects 322 formed from reservoirs of conductive material at the semiconductor die 302 and the contact pads 312 at the semiconductor die 304. The reservoirs of conductive material at the semiconductor die 302 and the contact pads may couple through a metal-metal bond. Given that the reservoirs of conductive material at the semiconductor die 302 and the contact pads 312 may couple to circuitry 318 and circuitry 320 at the respective semiconductor dies, electrical signals may be transmitted from the semiconductor die 302 and any circuitry coupled therewith (e.g., another semiconductor die) to the semiconductor die 304 and any circuitry coupled therewith (e.g., a PCB) and vice versa.

Figure 4:
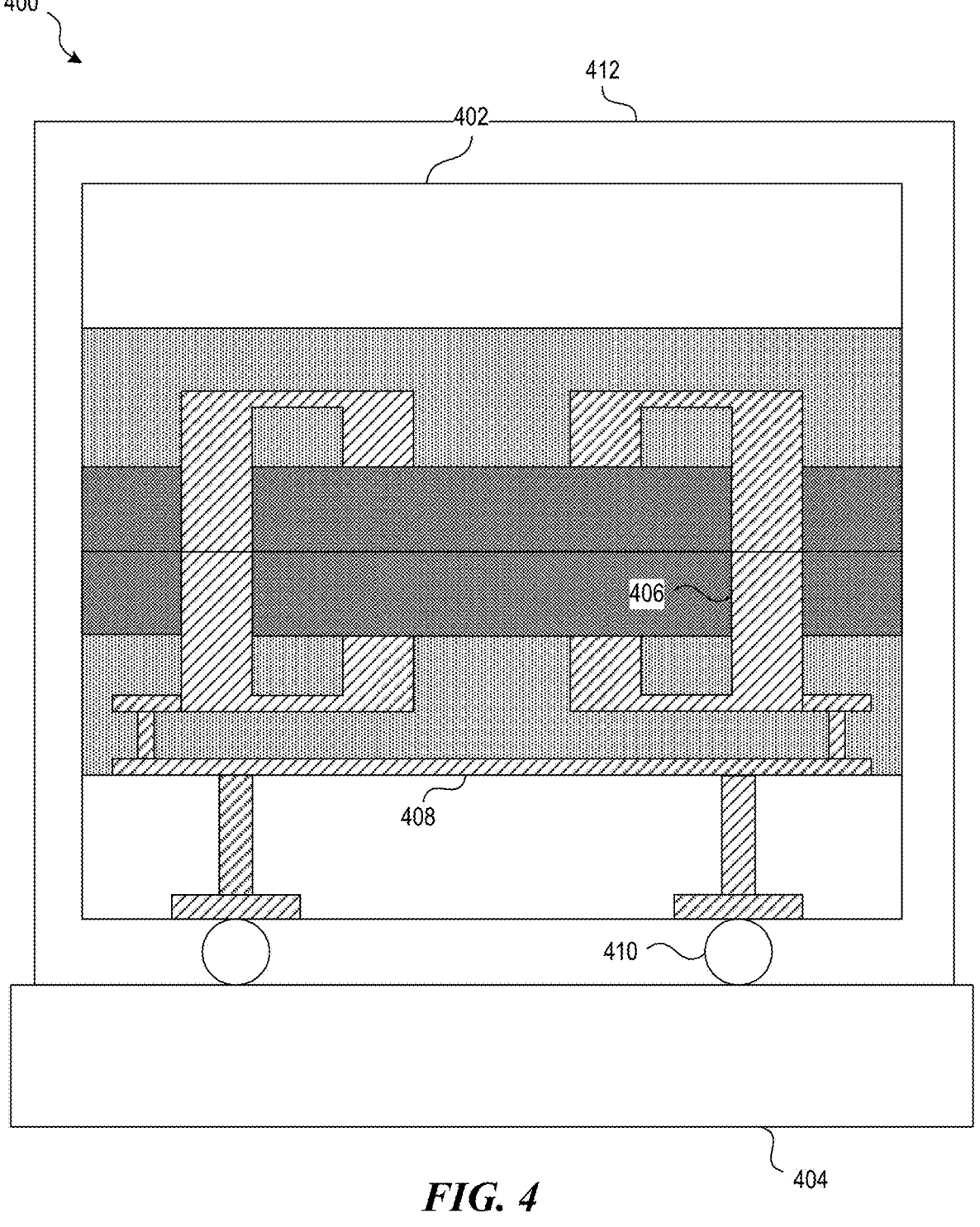
FIG. 4 illustrates a simplified schematic cross-sectional view of a semiconductor device assembly in accordance with an embodiment of the present technology.

FIG. 4 illustrates a simplified schematic cross-sectional view of a semiconductor device assembly 400 in accordance with an embodiment of the present technology. The semiconductor device assembly 400 includes stacked semiconductor dies 402 assembled onto a package-level substrate 404. The package-level substrate 404 may include a PCB, an interposer, or one or more additional dies. The stacked semiconductor dies 402 may mechanically couple through direct bonds between the dielectric layers of the semiconductor dies. The stacked semiconductor dies 402 may electrically couple (e.g., and mechanically couple) through interconnects 406, which are formed by annealing one or more reservoirs of conductive material to volumetrically expand the conductive material through openings in the dielectric layers. The interconnects 406 may couple to various circuitry 408 to provide various connectivity and functionality to the semiconductor device. For example, a base die may include vias that couple the interconnects 406 to traces and other circuitry within the base die. The traces may couple to one or more TSVs that extend to contact pads to provide external connectivity to the stacked semiconductor dies 402. For example, connective structures 410 (e.g., solder balls, copper pillars, etc.) couple the contact pads implemented at the base die and contact pads implemented at the substrate 404. The contact pads at the substrate 404 may couple to various routing circuitry that provides connectivity to one or more internal or external circuit components. Once assembled, the stacked semiconductor dies 402 may be at least partially encapsulated by an encapsulant 412 to protect them from environmental factors (e.g., moisture, particulates, static electricity, and physical impact).

Although in the foregoing example embodiment semiconductor device assemblies have been illustrated and described as including a particular number of semiconductor dies, in other embodiments assemblies can be provided with more or fewer semiconductor dies. For example, the two-die semiconductor devices illustrated in FIGS. 2 through 4 could be replaced with, for example, a vertical stack of semiconductor devices, a plurality of semiconductor devices, mutatis mutandis.

In accordance with one aspect of the present disclosure, the semiconductor devices illustrated in the assemblies of FIGS. 2-4 could be memory dies, such as dynamic random-access memory (DRAM) dies, NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 5:
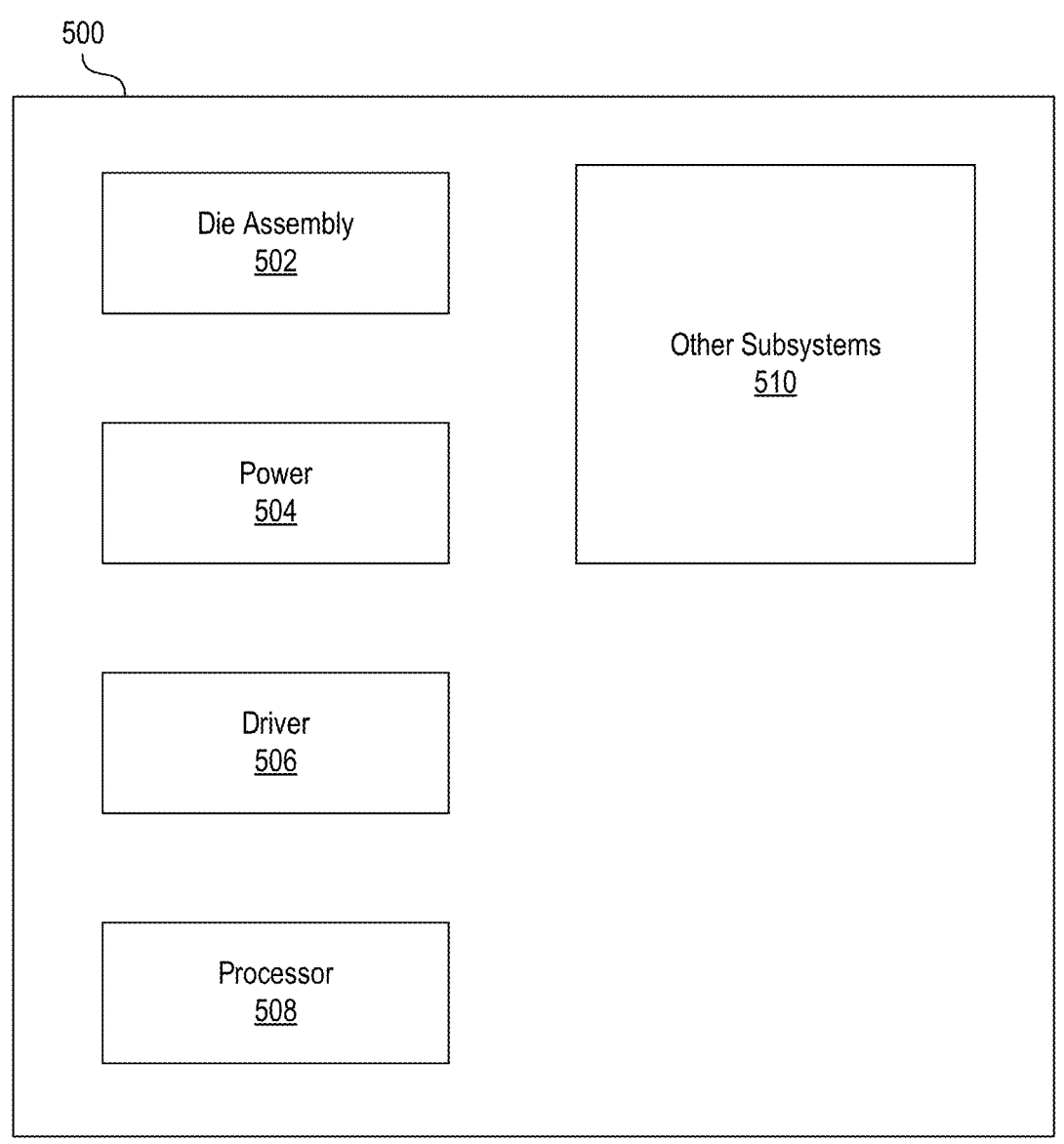
FIG. 5 illustrates a schematic view showing a system that includes a semiconductor device assembly configured in accordance with an embodiment of the present technology.

Any one of the semiconductor devices and semiconductor device assemblies described above with reference to FIGS. 2-4 can be incorporated into any of a myriad of larger and/or more complex systems, a representative example of which is system 500 shown schematically in FIG. 5. The system 500 can include a semiconductor device assembly 502 (e.g., or a discrete semiconductor device), a power source 504, a driver 506, a processor 508, and/or other subsystems or components 510. The semiconductor device assembly 502 can include features generally similar to those of the semiconductor devices described above with reference to FIGS. 2-4. The resulting system 500 can perform any of a wide variety of functions, such as memory storage, data processing, and/or other suitable functions. Accordingly, representative systems 500 can include, without limitation, handheld devices (e.g., mobile phones, tablets, digital readers, and digital audio players), computers, vehicles, appliances and other products. Components of the system 500 may be housed in a single unit or distributed over multiple, interconnected units (e.g., through a communications network). The components of the system 500 can also include remote devices and any of a wide variety of computer-readable media.

FIG. 6 illustrates an example method 600 for fabricating a semiconductor device assembly in accordance with an embodiment of the present technology. The method 600 may, for illustrative purposes, be described by way of example with respect to features, components, or elements of FIGS. 2-5. Although illustrated in a particular configuration, one or more operations of the method 600 may be omitted, repeated, or reorganized. Additionally, the method 600 may include other operations not illustrated in FIG. 6, for example, operations detailed in one or more other method described herein.

At 602, a first semiconductor die 202 is provided. The first semiconductor die 202 includes a first dielectric layer 206 having an opening 214. The first semiconductor die 202 further includes a reservoir of conductive material having a first portion (e.g., the reservoir of conductive material 210) located adjacent to the opening 214, a second portion (e.g., the reservoir of conductive material 218) remote from the opening 214, and a third portion (e.g., the reservoir of conductive material 222) coupling the first portion and the second portion. The second portion may be located at a different lateral location than the first portion. In some implementations, the first semiconductor die 202 includes internal circuitry 318 coupled to the reservoir of conductive material. In some cases, the internal circuitry 318 may not couple to the second portion only through the third portion. Any portion of the reservoir of conductive material may be at least partially located within the dielectric layer 206. The first portion may be exposed at the opening 214 and the second portion may be disposed under a portion of the dielectric layer 206 that does not include the opening 214 such that the conductive material at the second portion is not exposed at the exterior of the semiconductor die 202.

At 604, a second semiconductor die 204 is provided. The second semiconductor die 204 includes a second dielectric layer 208 and a contact pad 312 corresponding to the opening 214. In some implementations, the second dielectric layer 208 may include an additional opening 216 corresponding to the opening 214 and an additional reservoir of conductive material located adjacent to the additional opening 216. The additional reservoir of conductive material may include multiple portions, for example, a portion located adjacent to the opening 216 (e.g., the reservoir of conductive material 212), a remote portion (e.g., the reservoir of conductive material 220), and a connective portion (e.g., the reservoir of conductive material 224) coupling the first and second portions. The additional reservoir of conductive material 212 may be exposed at the exterior of the semiconductor die 204 to implement the contact pad 312.

At 606, the first semiconductor die 202 and the second semiconductor die 204 are aligned such that the opening 214 aligns with the contact pad 312. In doing so, an opening between the semiconductor dies may be created such that an interconnect 226 may be implemented at the opening. In aspects, the method 600 may further include mounting the first semiconductor die 202 on the second semiconductor die 204. A bond may be created between the first dielectric layer 206 and the second dielectric layer 208 to mechanically couple the semiconductor dies. The bond may be created before, during, or after forming an interconnect 226 between the semiconductor dies.

At 608, the first portion (e.g., reservoir of conductive material 210), the second portion (e.g. reservoir of conductive material 218), and the third portion (e.g., reservoir of conductive material 222) may be heated. The heating may cause the second portion to expand into the third portion, the third portion to expand into the first portion, and the first portion to expand through the opening 214 to form an interconnect 226 electrically coupling the first semiconductor die 202 and the second semiconductor die 204. The first portion and the second portion may volumetrically expand in different directions. For example, the first portion may expand vertically through the opening 214, and the second portion may expand laterally and push more conductive material from the third portion through the opening 214. In some implementations, the second semiconductor die 204 may include an additional reservoir of conductive material, and the heating may be effective to cause the additional reservoir of conductive material to expand through the opening 216 to form the interconnect 226. In general, however, performing the method 600 may fabricate a robust and well-connected semiconductor device.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown or are not described in detail to avoid obscuring other aspects of the technology. In general, it should be understood that various other devices, systems, and methods in addition to those specific embodiments disclosed herein may be within the scope of the present technology.

What is claimed is:

1. A method of making a semiconductor device assembly, comprising:
   providing a first semiconductor die including:
      a first layer of dielectric material having an opening; and
      a reservoir of conductive material having a first portion located adjacent to the opening, a second portion remote from the opening, and a third portion coupling the first portion and the second portion;
   providing a second semiconductor die including:
      a second layer of dielectric material; and
      a contact pad corresponding to the opening;
   aligning the first semiconductor die and the second semiconductor die such that the opening aligns with the contact pad; and
   heating the reservoir of conductive material effective to cause the second portion to volumetrically expand into the third portion, the third portion to volumetrically expand into the first portion, and the first portion to volumetrically expand through the opening to form an interconnect electrically coupling the first semiconductor die and the second semiconductor die at the contact pad.

2. The method of claim 1, wherein:
   the second layer of dielectric material has an additional opening corresponding to the opening;
   the contact pad includes an additional reservoir of conductive material adjacent to the additional opening; and
   the method further includes heating the additional reservoir of conductive material effective to cause the additional reservoir of conductive material to volumetrically expand through the additional opening to form the interconnect electrically coupling the first semiconductor die and the second semiconductor die.

3. The method of claim 1, wherein a volume of the reservoir of conductive material is at least 10 times a volume of the opening.

4. The method of claim 1, wherein:
   the first portion volumetrically expands in a first direction; and
   the second portion volumetrically expands in a second direction different than the first direction.

5. The method of claim 1, further comprising creating a bond between the first layer of dielectric material and the second layer of dielectric material to align the first opening and the contact pad.

6. The method of claim 1, wherein the second portion is disposed under a portion of the first layer of dielectric material that does not include the opening.

7. A semiconductor device assembly, comprising:
   a first semiconductor die including:
      a first layer of dielectric material having an opening; and
      a reservoir of conductive material having a first portion located adjacent to and extending through the opening, a second portion remote from the opening, and a third portion coupling the first portion and the second portion and having a size configured to permit volumetric expansion of the second portion through the third portion to displace some of the conductive material from the third portion into the first portion; and a second semiconductor die including:

a second layer of dielectric material; and a contact pad corresponding to the opening, wherein the reservoir of conductive material and the contact pad are coupled through a metal-metal bond to form an interconnect at the opening, the interconnect coupling the first semiconductor die and the second semiconductor die.

8. The semiconductor device assembly of claim 7, wherein:

the second layer of dielectric material has an additional opening corresponding to the opening;

the contact pad includes an additional reservoir of conductive material adjacent to and extending through the additional opening; and the reservoir of conductive material and the additional reservoir of conductive material couple through a metal-metal bond to form the interconnect at the opening and at the additional opening.

9. The semiconductor device assembly of claim 7, wherein the conductive material includes copper.

10. The semiconductor device assembly of claim 7, wherein the first semiconductor die further includes internal circuitry coupled with the reservoir of conductive material.

11. The semiconductor device assembly of claim 10, wherein the second portion couples with the internal circuitry only through the third portion.

12. The semiconductor device assembly of claim 7, wherein the first portion and the second portion are at least partially located at a same vertical layer of the first semiconductor die.

13. The semiconductor device assembly of claim 7, wherein the third portion comprises one or more conductive traces coupling the first portion and the second portion.

14. The semiconductor device assembly of claim 7, wherein the second portion is disposed under a portion of the first layer of dielectric material that does not include the opening.

15. The semiconductor device assembly of claim 7, wherein the first portion has a first size and the second portion has a second size smaller than the first size.

16. The semiconductor device assembly of claim 7, wherein the first portion and the opening have a same width.

17. A semiconductor die, comprising:

a first layer of dielectric material having an opening; and a reservoir of conductive material configured to volumetrically expand through the opening to form an interconnect coupling the semiconductor die and an additional semiconductor die, the reservoir of conductive material including:

a first portion located adjacent to and extending through the opening;

a second portion remote from the opening; and a third portion coupling the first portion and the second portion and having a size configured to permit volumetric expansion of the second portion through the third portion to displace some of the conductive material from the third portion into the first portion, wherein the first portion is exposed at the opening and the second portion is disposed under a portion of the first layer of dielectric material that does not include the opening.

18. The semiconductor die of claim 17, further comprising internal circuitry coupled with the reservoir of conductive material.

19. The semiconductor die of claim 18, wherein the second portion couples with the internal circuitry only through the third portion.

20. The semiconductor die of claim 17, wherein the third portion comprises one or more conductive traces coupling the first portion and the second portion.

* * * * *